(12) United States Patent
Jacobsen et al.

(10) Patent No.: US 12,091,311 B2
(45) Date of Patent: Sep. 17, 2024

(54) WAFER LEVEL PACKAGING OF MEMS

(71) Applicant: Texas Instruments Incorporated, Dallas, TX (US)

(72) Inventors: Stuart M. Jacobsen, Frisco, TX (US); Wei-Yan Shih, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1326 days.

(21) Appl. No.: 15/463,246

(22) Filed: Mar. 20, 2017

(65) Prior Publication Data
US 2017/0217759 A1    Aug. 3, 2017

Related U.S. Application Data

(62) Division of application No. 14/467,616, filed on Aug. 25, 2014, now Pat. No. 9,630,835.

(51) Int. Cl.
*B81B 7/00*    (2006.01)
*B81C 1/00*    (2006.01)

(52) U.S. Cl.
CPC ........ *B81B 7/0051* (2013.01); *B81C 1/00333* (2013.01); *B81C 1/00349* (2013.01); *B81C 1/00396* (2013.01); *B81C 1/00523* (2013.01); *B81C 1/00666* (2013.01); *B81B 2207/07* (2013.01); *B81B 2207/097* (2013.01)

(58) Field of Classification Search
CPC ............ B81C 1/00555; B81C 1/00642; B81C 1/00476; B81C 1/00388; B81C 1/00261; B81C 1/00269; B81C 1/00277; B81C 1/00333
See application file for complete search history.

(56) References Cited

U.S. PATENT DOCUMENTS

2005/0263866 A1* 12/2005 Wan ..................... B81C 1/00269
                                                        257/678
2007/0190747 A1*  8/2007 Humpston .......... B81C 1/00285
                                                        438/460

(Continued)

FOREIGN PATENT DOCUMENTS

CN        101009234       8/2007
CN        101188203       5/2008

(Continued)

OTHER PUBLICATIONS

Lin, Chingyi & Zhang, Yadong & Abdulagatov, Aziz & Yang, Ronggui & George, Steven & Lee, Y . . . (2010). ALD-enabled hermetic sealing for polymer-based wafer level packaging of MEMS. Proceedings of the IEEE International Conference on Micro Electro Mechanical Systems (MEMS) (Year: 2010).*

*Primary Examiner* — Brigitte A Paterson
(74) *Attorney, Agent, or Firm* — Ronald O. Neerings; Frank D. Cimino (57) ABSTRACT

A MEMS device is formed by applying a lower polymer film to top surfaces of a common substrate containing a plurality of MEMS devices, and patterning the lower polymer film to form a headspace wall surrounding components of each MEMS device. Subsequently an upper polymer dry film is applied to top surfaces of the headspace walls and patterned to form headspace caps which isolate the components of each MEMS device. Subsequently, the MEMS devices are singulated to provide separate MEMS devices.

13 Claims, 12 Drawing Sheets

(56) References Cited

U.S. PATENT DOCUMENTS

| | | | |
|---|---|---|---|
| 2007/0273013 A1 | 11/2007 | Kohl et al. | |
| 2008/0188026 A1 | 8/2008 | Wang et al. | |
| 2010/0164126 A1 | 7/2010 | Takahashi et al. | |
| 2013/0076458 A1 | 3/2013 | Katou et al. | |
| 2013/0277777 A1* | 10/2013 | Chang | B81B 7/00 |
| | | | 257/418 |
| 2014/0015900 A1 | 1/2014 | Zhang et al. | |
| 2014/0029078 A1* | 1/2014 | Fennell | G02B 26/001 |
| | | | 359/238 |
| 2014/0103518 A1 | 4/2014 | Fu et al. | |
| 2015/0021720 A1* | 1/2015 | Ollier | B81B 7/0061 |
| | | | 257/415 |

FOREIGN PATENT DOCUMENTS

| | | |
|---|---|---|
| CN | 101759135 | 6/2010 |
| CN | 102874745 | 1/2013 |
| CN | 102900641 | 1/2013 |
| TW | 200834753 | 8/2008 |

\* cited by examiner

WAFER LEVEL PACKAGING OF MEMS

CROSS REFERENCE TO RELATED APPLICATIONS

This application is a divisional of U.S. Nonprovisional patent application Ser. No. 14/467,616, filed Aug. 25, 2014, the contents of which is herein incorporated by reference in its entirety.

FIELD OF THE INVENTION

This invention relates to the field of microelectronic mechanical systems (MEMS) devices. More particularly, this invention relates to packaging in MEMS devices.

BACKGROUND OF THE INVENTION

MEMS devices may require a cavity, also referred to as a headspace, in a package to allow proper operation. Forming a package for the MEMS device with a headspace that is hermetically sealed from the outside environment at a desired cost may be problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A MEMS device may be formed by applying a lower polymer film to top surfaces of a plurality of MEMS devices on a common substrate, and patterning the lower polymer film to form headspace wall surrounding components of each MEMS device. Subsequently an upper polymer dry film is applied to top surfaces of the headspace walls and patterned to form headspace caps which isolate the components of each MEMS device. Subsequently, the MEMS devices are singulated to provide separate MEMS devices.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A MEMS device may be formed by applying a lower polymer layer to top surfaces of a plurality of MEMS devices on a common substrate, and patterning the lower polymer film to form headspace walls on each MEMS device which surround components of each corresponding MEMS device to provide a headspace for each MEMS device. The lower polymer layer may be a dry film material or a spin coat material. Pillars and/or fins inside of the headspace and/or outside of the headspace may be concurrently formed with the headspace walls to support subsequently formed headspace caps. Internal dividers which separate each headspace into two or more compartments may also be formed concurrently with the headspace walls.

Subsequently an upper polymer dry film is applied to the headspace walls and patterned to form the headspace caps on each MEMS device. The combination of the headspace wall and headspace cap on each MEMS devices isolates the components of that MEMS device. Scribe lines between adjacent MEMS devices on the common substrate are free of the headspace walls and headspace caps. The MEMS devices may have bondpads on the top surface; the headspace walls are formed so that the bondpads are outside the headspace, and the bondpads are free of the headspace walls and headspace caps. Alternatively, the MEMS devices may have through-substrate-vias (TSVs) with bondpads on a bottom surface of the substrate; in this case the headspace walls and headspace caps may extend to edges of the MEMS device.

Subsequently, the MEMS devices are singulated to provide separate MEMS devices. After singulation, the MEMS devices may be encapsulated in a packaging material such as mold compound.

Figure 1A:
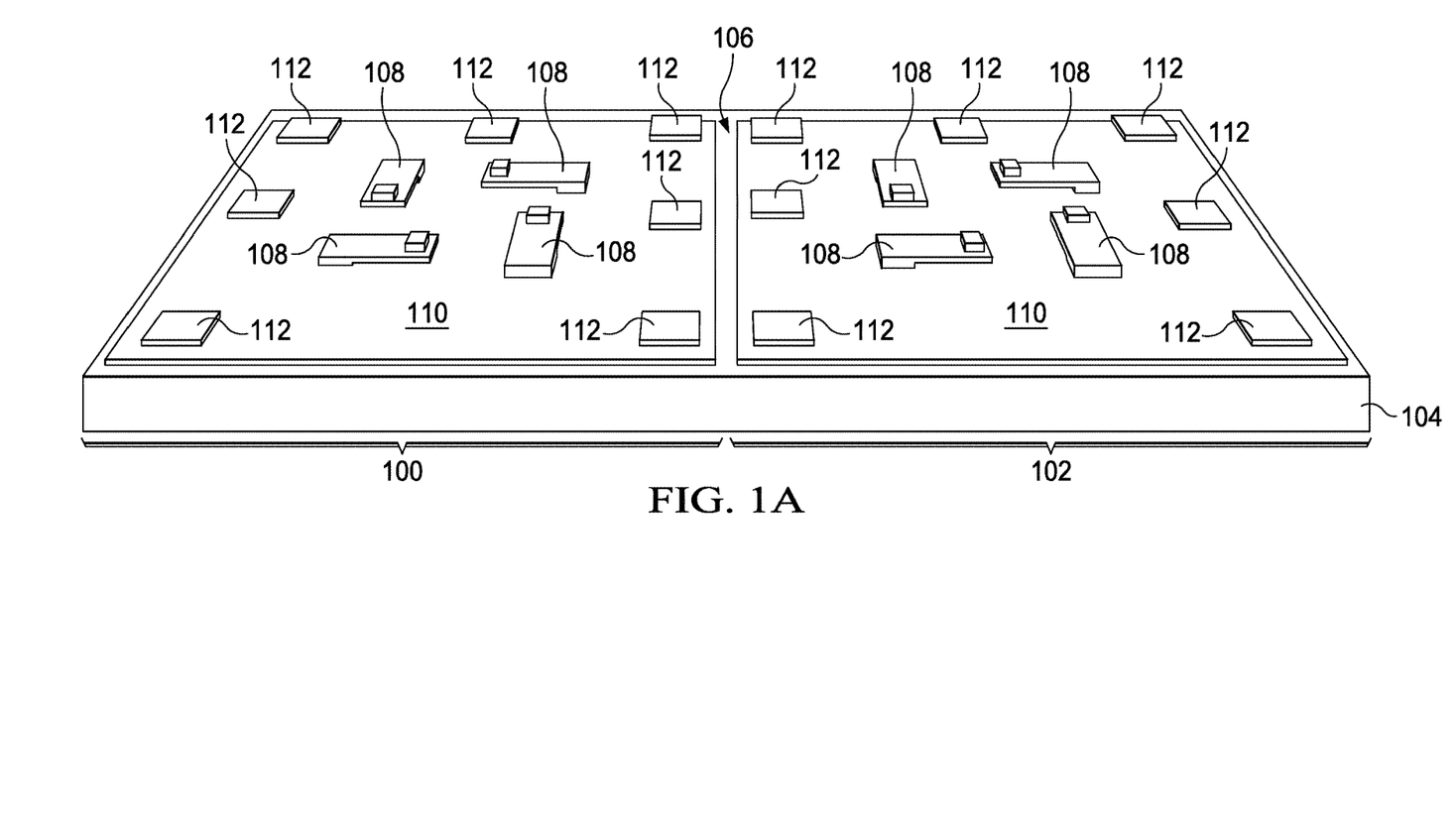
FIG. 1A through FIG. 1G are perspective views of an exemplary MEMS device, depicted in successive stages of fabrication.

FIG. 1A through FIG. 1G are perspective views of an exemplary MEMS device, depicted in successive stages of fabrication. Referring to FIG. 1A, the MEMS device 100 is formed concurrently with at least one other MEMS device 102 on a common substrate 104. The substrate 104 may be, for example, a silicon wafer, a ceramic carrier, a glass or sapphire sheet, or other substrate appropriate for forming the MEMS device 100. At least one scribe line 106 separates the MEMS device 100 from the at least one other MEMS device 102.

The MEMS devices 100 and 102 include components 108 disposed at a top surface 110 in a central region of each MEMS device 100 and 102, and bondpads 112 disposed at the top surface 110 proximate to edges of the MEMS devices 100 and 102. The components 108 may include, for example, cantilevers with proof masses, as depicted in FIG. 1A. Other components 108 are within the scope of the instant example. In the instant example, sacrificial layers supporting the components 108, such as sacrificial polymer layers, silicon dioxide layers or polysilicon layers, are removed before proceeding to the next fabrication step.

Figure 1B:
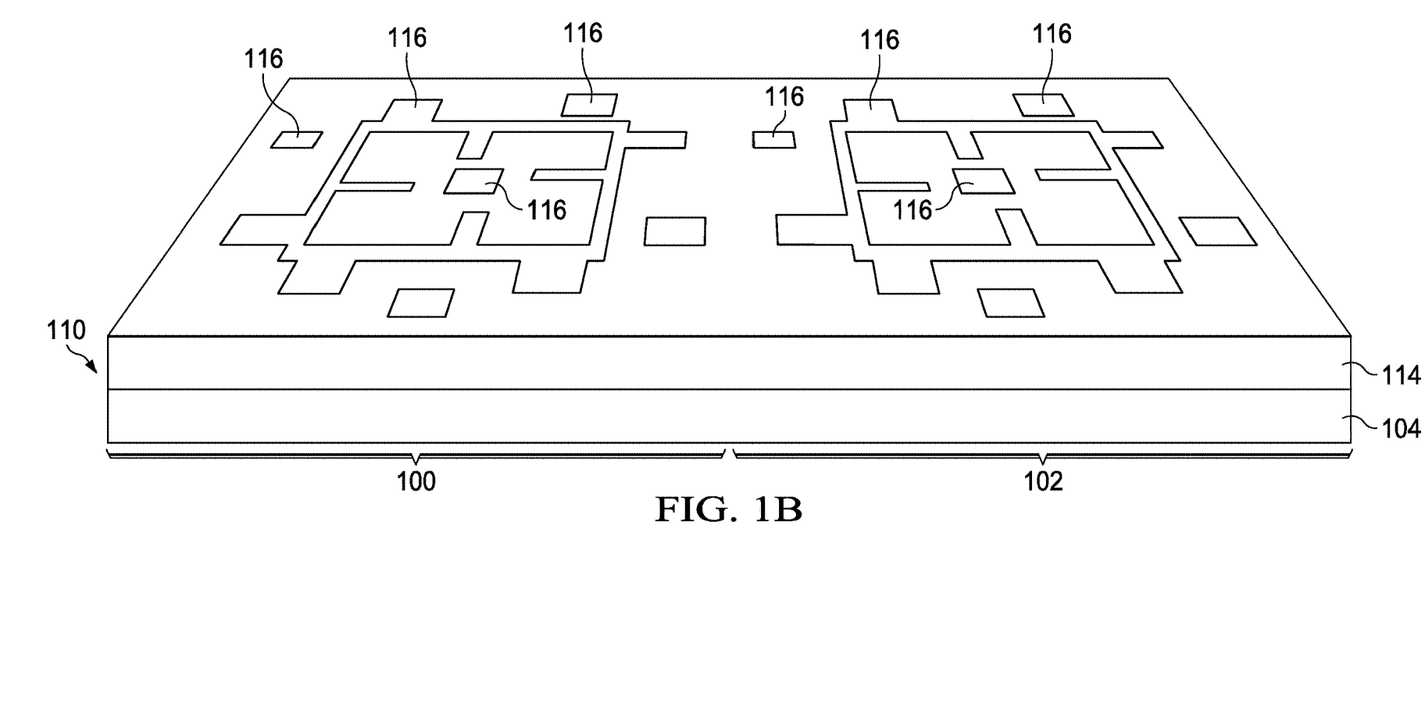

Referring to FIG. 1B, a lower polymer layer 114 is applied to the top surface 110 of the MEMS devices 100 and 102. In one version of the instant example, the lower polymer layer 114 may be a dry film which is applied as a sheet. In another version, the lower polymer layer 114 may be a spin coat material which is applied as a mixture of polymer and solvent by dispensing the mixture onto the top surface 110 and spinning the substrate 104 to distribute the mixture and subsequently baking the mixture to remove at least a portion of the solvent. More than one dispense and spin cycle may be used to obtain a desired thickness of the lower polymer layer 114. The lower polymer layer 114 may include, for example, photoresist, photoactive polyimide or photoimageable epoxy. The lower polymer layer 114 may be, for example, 5 microns to 100 microns thick, depending on the components 108 of FIG. 1A and requirements of the MEMS device 100.

The lower polymer layer 114 is exposed with ultraviolet light to define areas 116 for subsequently formed headspace walls. Instances of the lower polymer film which use a negative tone photolithographic process, such as polyisoprene photoresist, polyimide, or SU-8 epoxy, are exposed in the areas 116 for the headspace walls. Instances of the lower polymer film which use a positive tone photolithographic process, such as novolak resin photoresist, are exposed outside the areas 116 for the headspace walls. The areas 116 may include areas for pillars, fins or dividers.

Figure 1C:
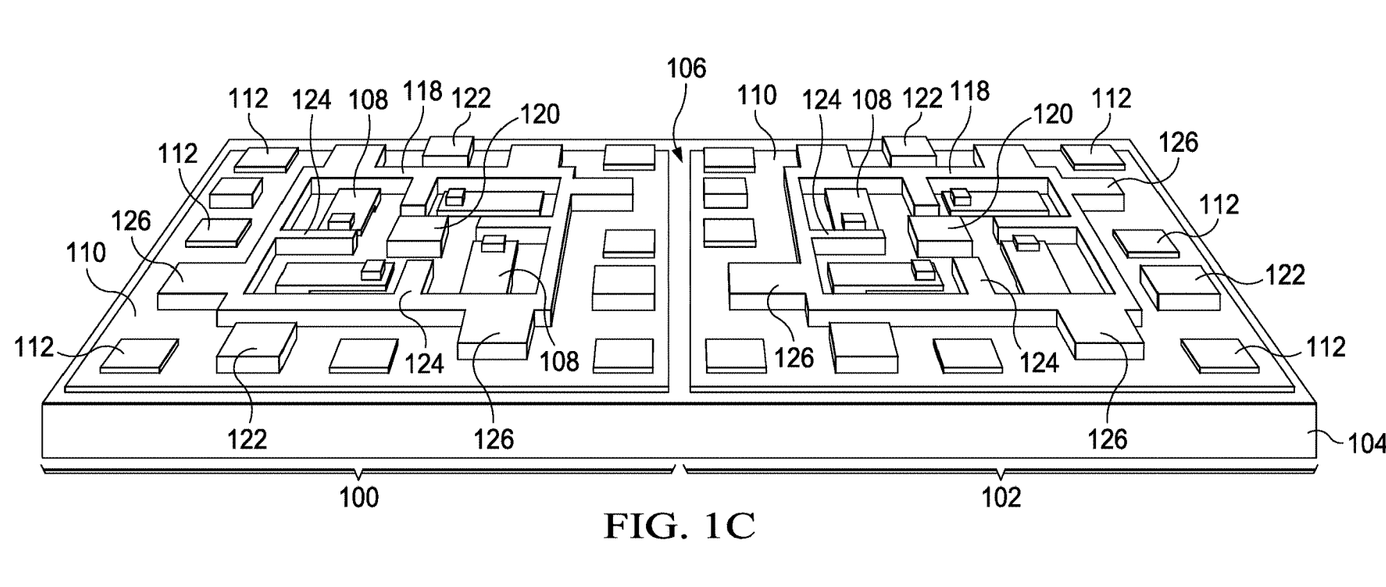

Referring to FIG. 1C, a develop process removes unwanted polymer from the lower polymer layer 114 of FIG. 1B to form headspace walls 118 on the top surfaces 110 of the MEMS devices 100 and 102. The headspace walls 118 surround the components 108 in each of the MEMS devices 100 and 102. The headspace walls 118 are not formed in the scribe lines 106. Internal pillars 120, external pillars 122, internal fins 124 and/or external fins 126 may be formed concurrently with the headspace walls 118. Internal pillars 120 are located inside the headspace walls 118 and are separate from the headspace walls 118. External pillars 122 are located outside the headspace walls 118 and are separate from the headspace walls 118. Internal fins 124 are located inside the headspace walls 118 and are contiguous with the headspace walls 118. External fins 126 are located outside the headspace walls 118 and are contiguous with the headspace walls 118. The headspace walls 118 may be baked to release volatile material which was present in the lower polymer layer 114 or introduced by the develop process.

Figure 1D:
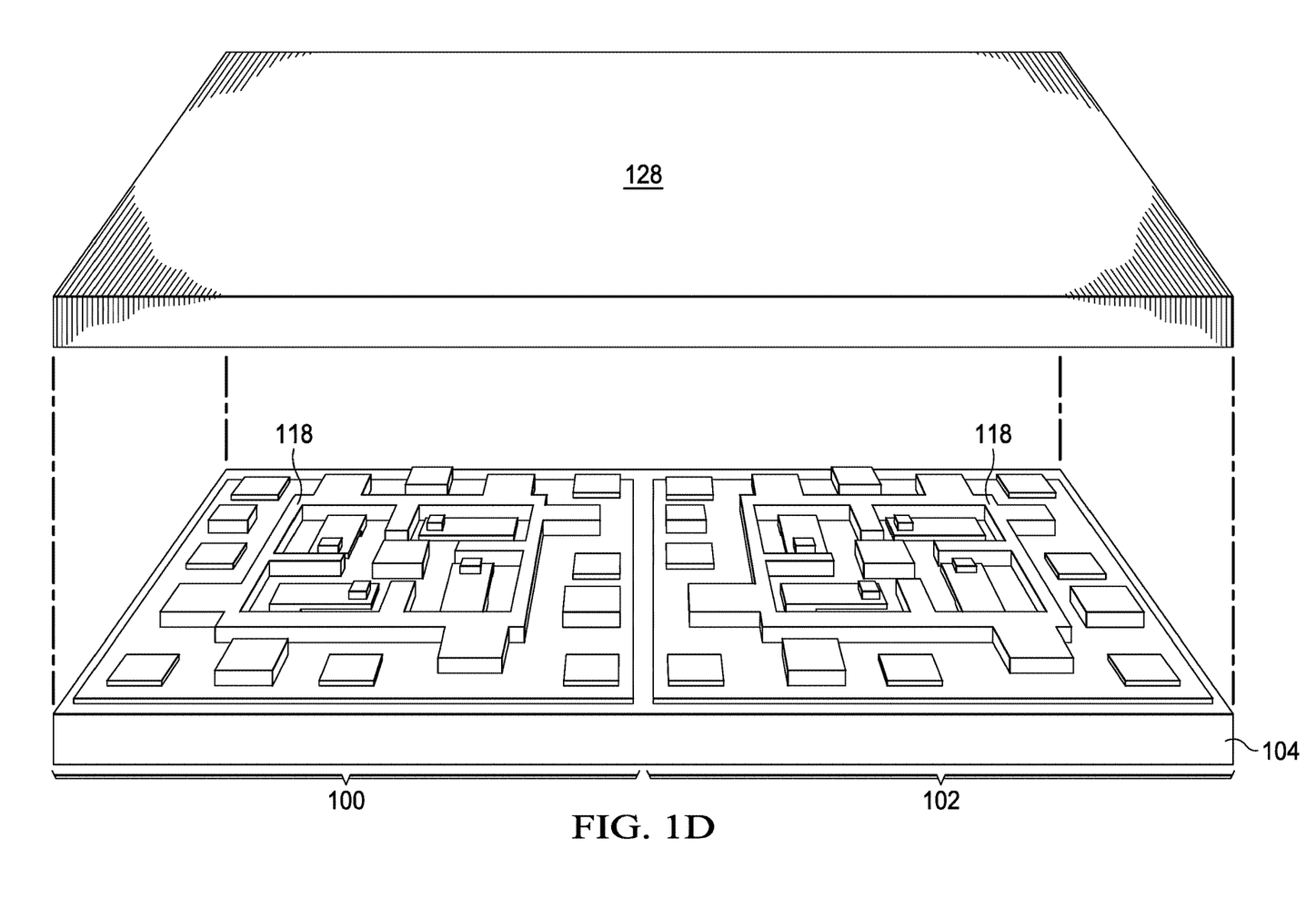

Referring to FIG. 1D, an upper polymer dry film 128 is applied to the headspace walls 118. The upper polymer dry film 128 may include, for example, SU-8 epoxy, 10 microns to 300 microns thick. Presence of the internal pillars 120, external pillars 122, internal fins 124 and/or external fins 126 may advantageously reduce sagging or distortion of the upper polymer dry film 128 upon application to the headspace walls 118.

Figure 1E:
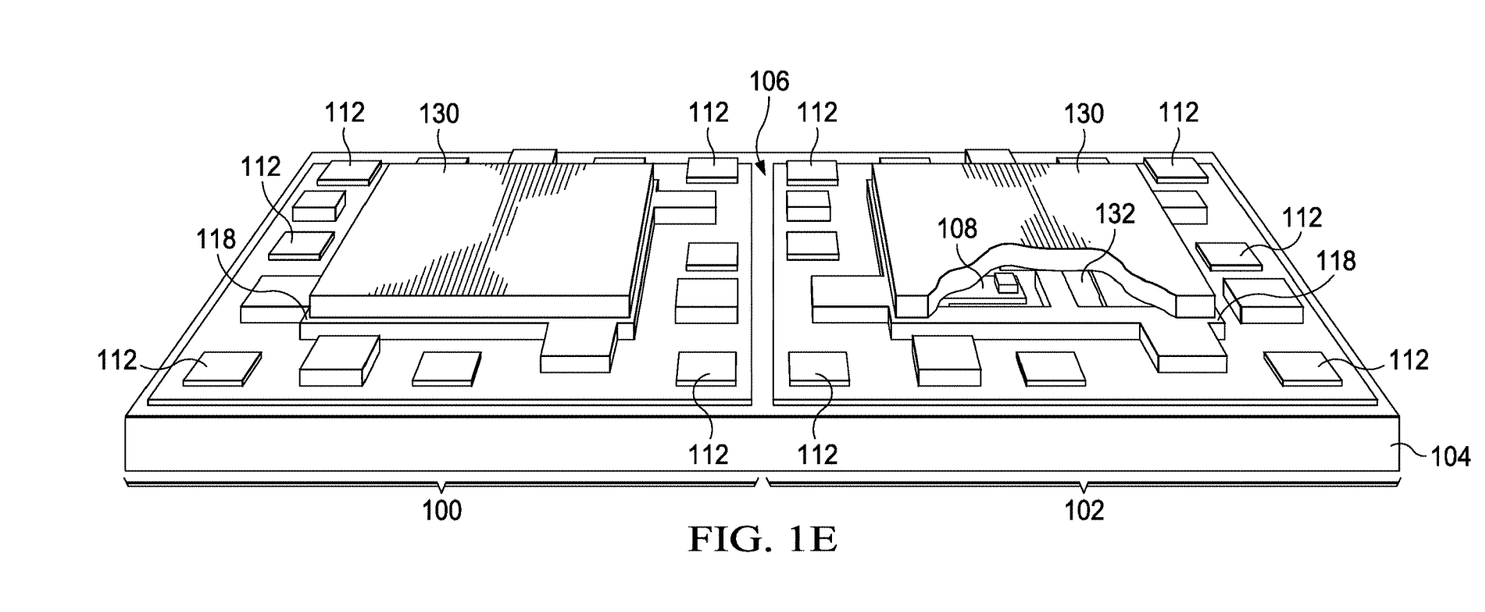

Referring to FIG. 1E, the upper polymer dry film 128 of FIG. 1D is patterned by exposure to ultraviolet light and subsequently developed to form headspace caps 130 on the headspace walls 118. On each MEMS device 100 and 102, the headspace wall 118 and the headspace cap 130 combine to isolate a headspace 132 over the components 108. The headspace caps 130 do not extend into the scribe lines 106 or extend over the bondpads 112.

Figure 1F:
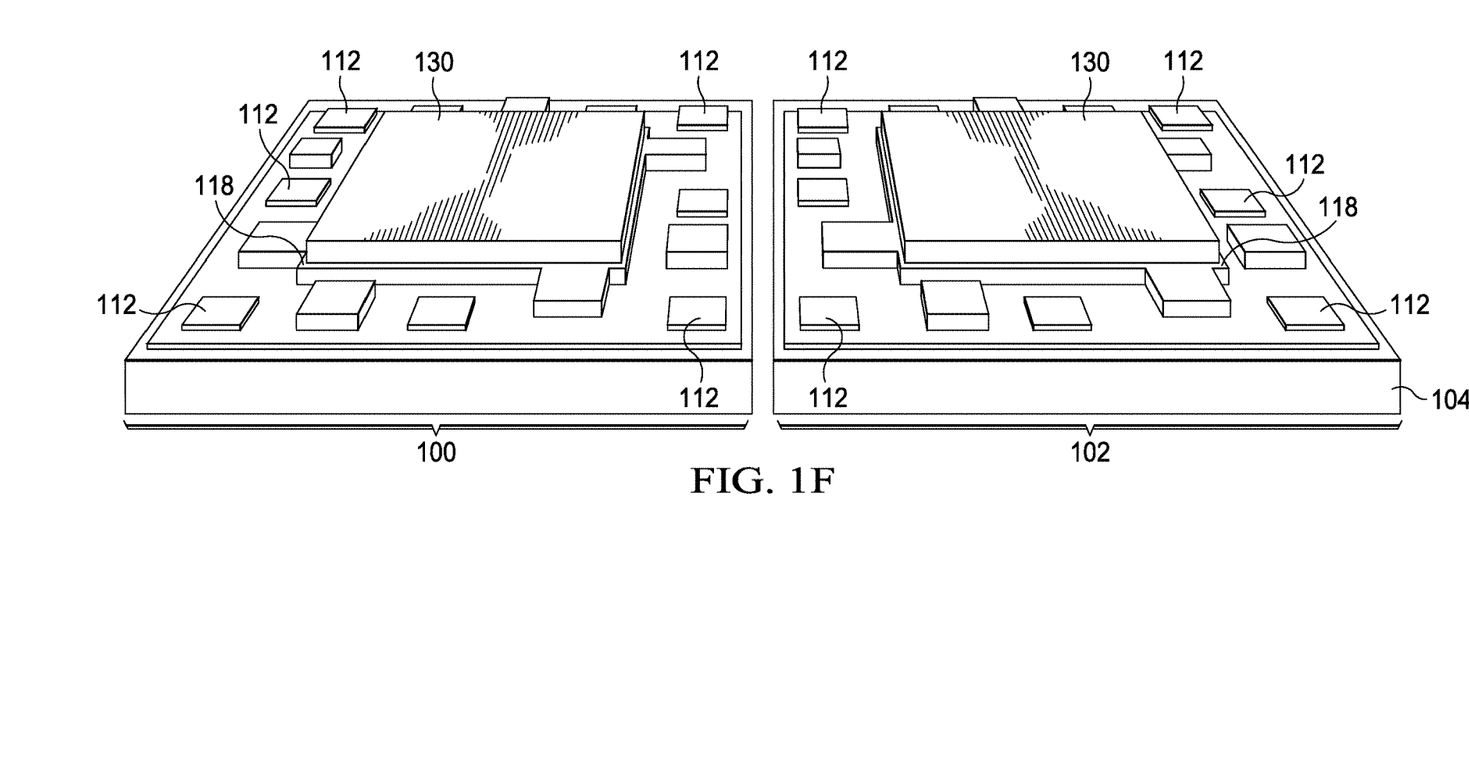

Referring to FIG. 1F, the MEMS devices 100 and 102 are subsequently singulated, for example by sawing or scribing, so as to produce separate MEMS devices 100 and 102. The headspace walls 118 and the headspace caps 130 may advantageously protect the components 108 of FIG. 1E during the singulation process, for example from saw kerf debris or scribe particles.

Figure 1G:
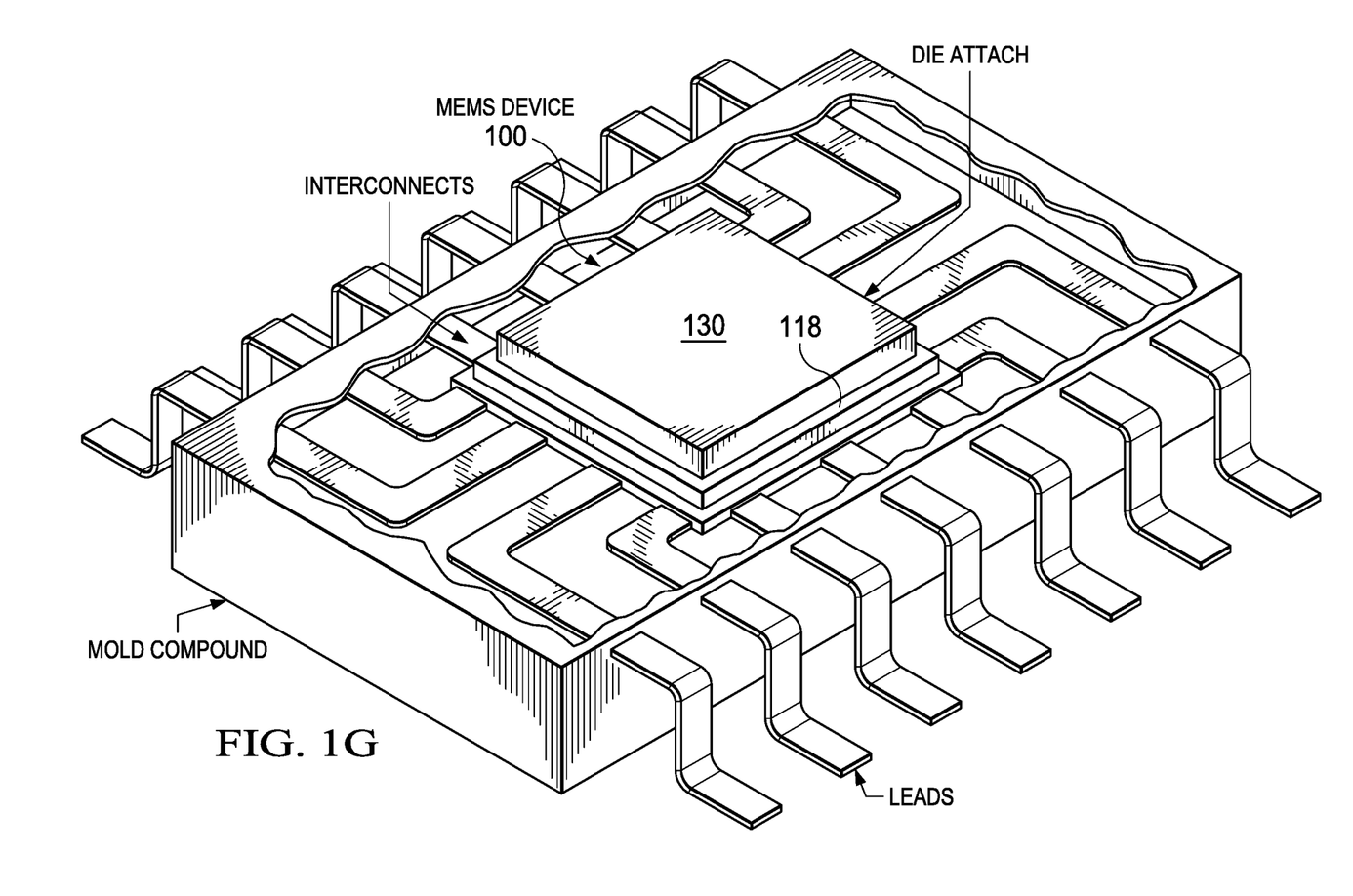

Referring to FIG. 1G, the MEMS device 100 may optionally be encapsulated, for example by mold compound in a leaded package, as depicted in FIG. 1G. A metal film such as aluminum may be formed over the headspace walls 118 and the headspace caps 130 before encapsulation with the mold compound to further protect the MEMS device from contaminants. The headspace wall 118 and the headspace cap 130 may advantageously protect the components 108 of FIG. 1E during the encapsulation process from the mold compound. Other schemes of packaging the MEMS device are within the scope of the instant example.

Figure 2A:
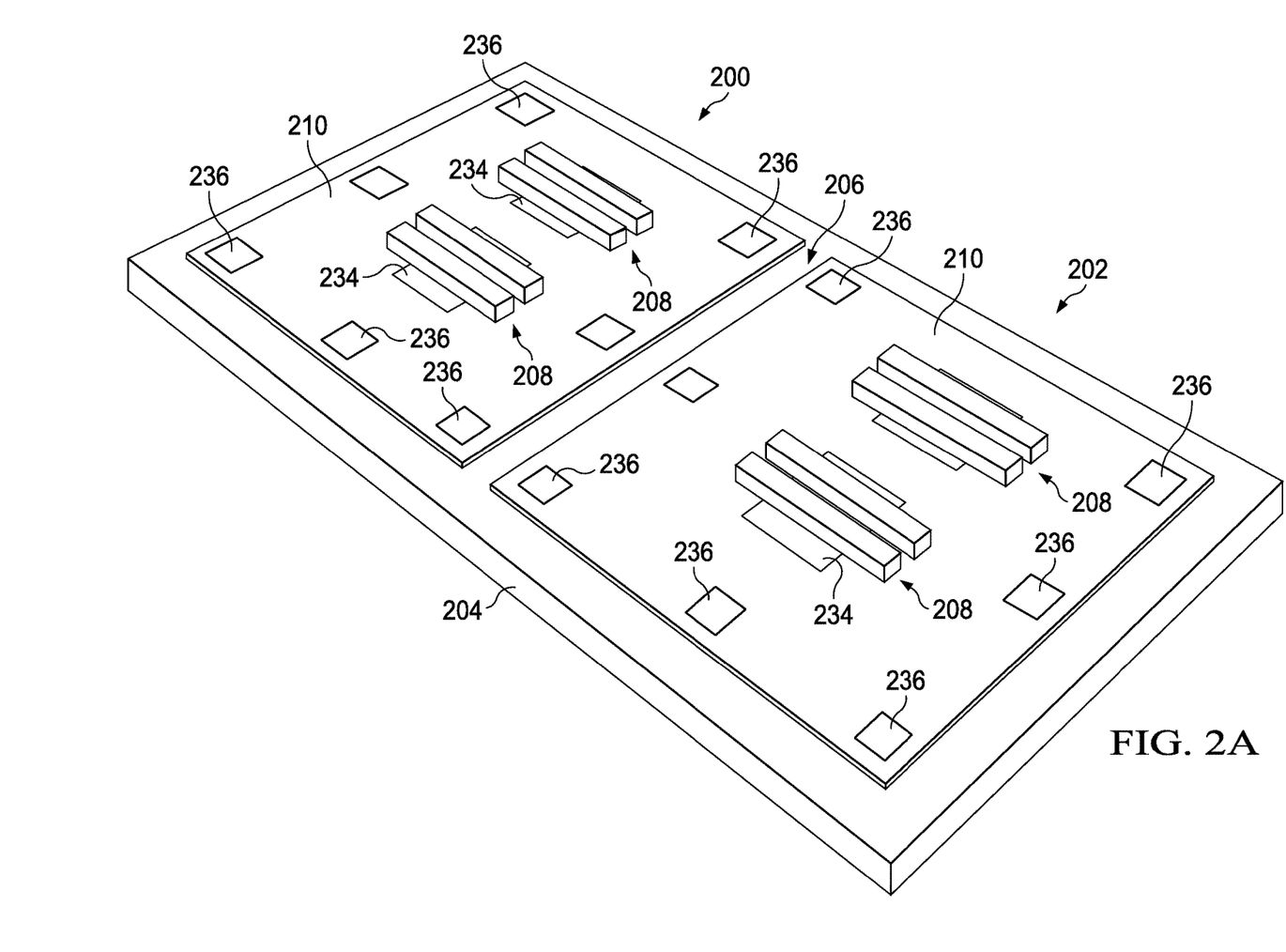
FIG. 2A through FIG. 2E are perspective views of another exemplary MEMS device, depicted in successive stages of fabrication.

FIG. 2A through FIG. 2E are perspective views of another exemplary MEMS device, depicted in successive stages of fabrication. Referring to FIG. 2A, the MEMS device 200 is formed concurrently with at least one other MEMS device 202 on a common substrate 204. At least one scribe line 206 separates the MEMS device 200 from the at least one other MEMS device 202.

The MEMS devices 200 and 202 include components 208 disposed at a top surface 210 in a central region of each MEMS device 200 and 202. The components 208 may be, for example, beam resonators 208 as depicted in FIG. 2A. In the instant example, sacrificial material 234 such as photoresist, polyimide, silicon dioxide or polysilicon, is present in each MEMS device 200 and 202, for example under beams of the beam resonators 208. In the instant example, through-substrate-vias (TSVs) 236 are formed through the substrate 204 to electrically connect the components 208 to bondpads on a bottom surface of the substrate 204.

Figure 2B:
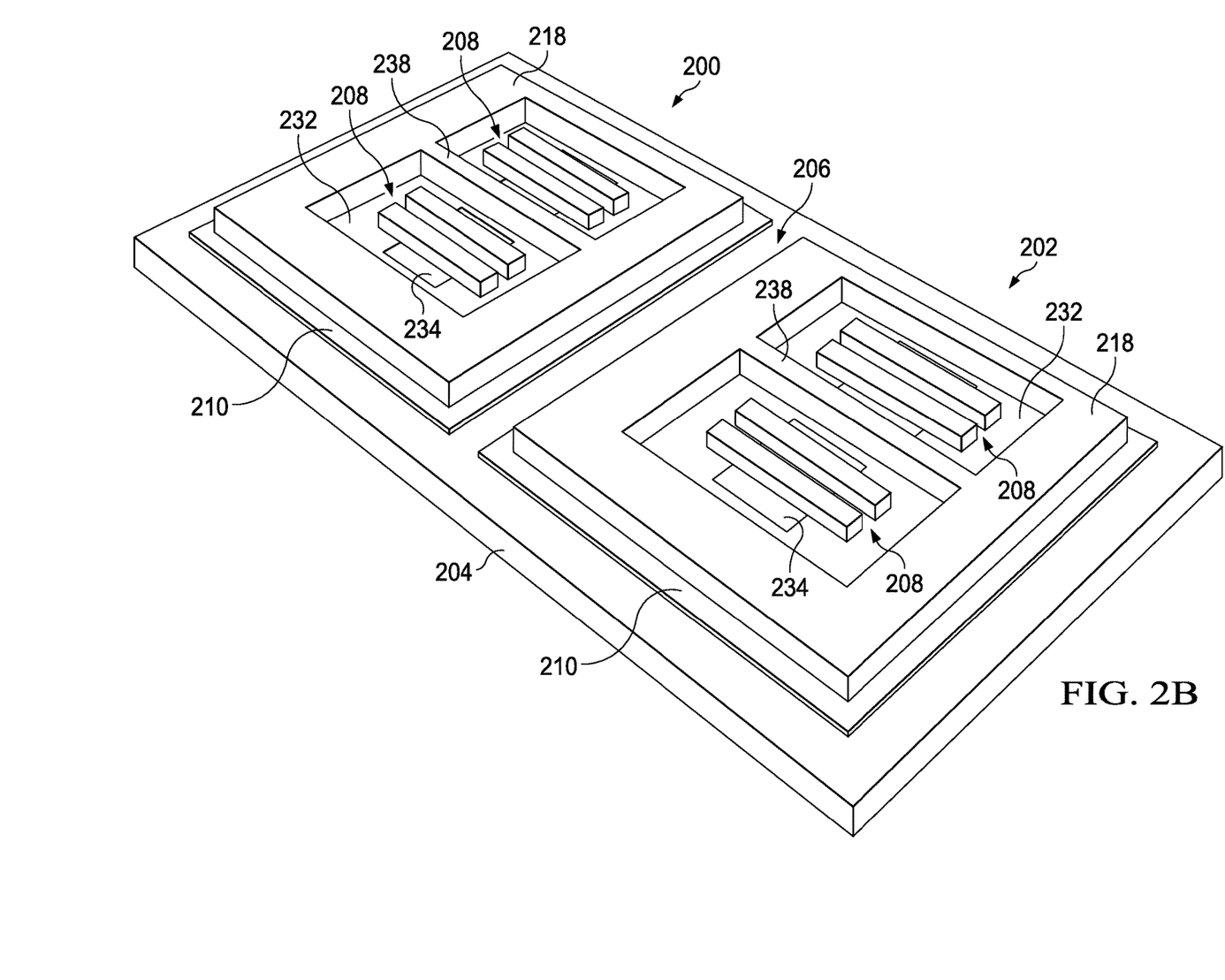

Referring to FIG. 2B, a lower polymer layer is applied to the top surface 210 of the MEMS devices 200 and 202 and patterned to form headspace walls 218. The headspace walls 218 surround the components 208 in each MEMS device 200 and 202. In the instant example, dividers 238 are formed concurrently with the headspace walls 218 so as to form separate compartments in the headspace 232 of each MEMS device 200 and 202. The headspace walls 218 do not extend into the scribe lines 206, but may overlap the TSVs 236 of FIG. 2A.

Figure 2C:
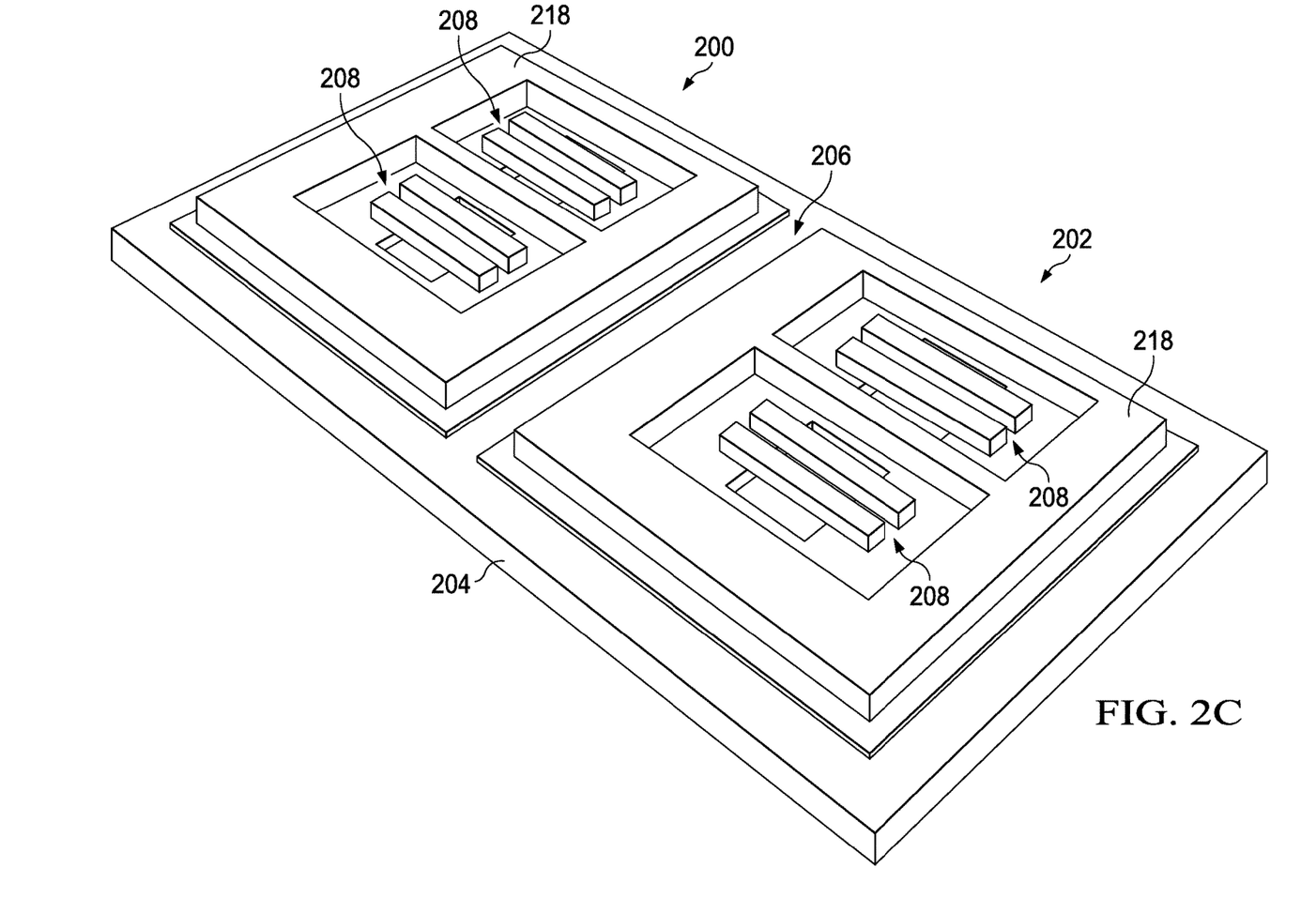

Referring to FIG. 2C, the sacrificial material 234 of FIG. 2A is removed after the headspace walls 218 are formed, so as to release the components 208. The sacrificial material 234 may be removed, for example, using a downstream asher. The sacrificial material 234 is removed without breaching the headspace walls 218. Initial dimensions of the headspace walls 218 may be selected to compensate for material loss during removal of the sacrificial material 234.

Figure 2D:
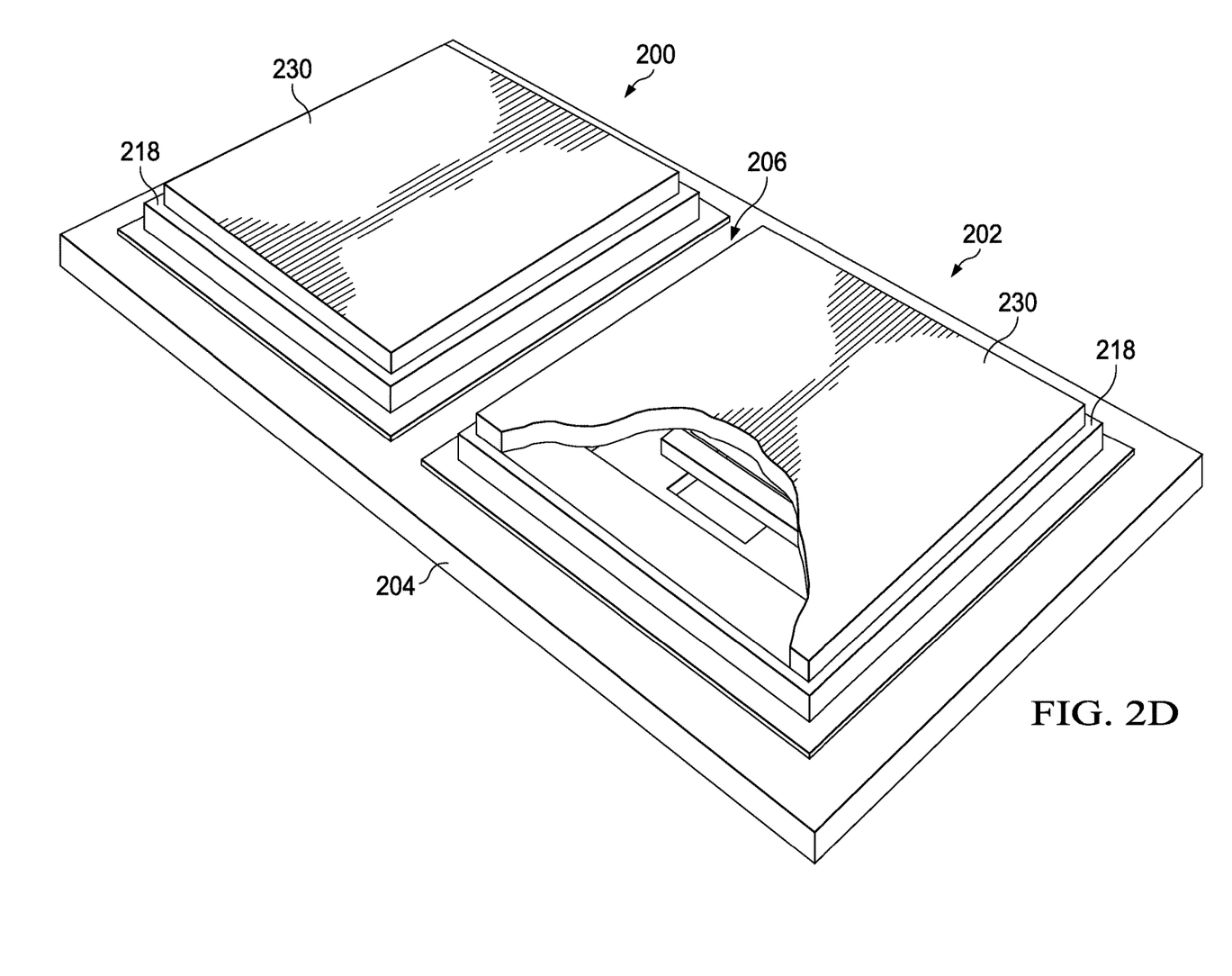

Referring to FIG. 2D, an upper polymer dry film is applied to the headspace walls 218 and patterned to form headspace caps 230. On each MEMS device 200 and 202, the headspace wall 218 and the headspace cap 230 combine to isolate a headspace 232 over the components 208. The headspace caps 230 do not extend into the scribe lines 206.

Figure 2E:
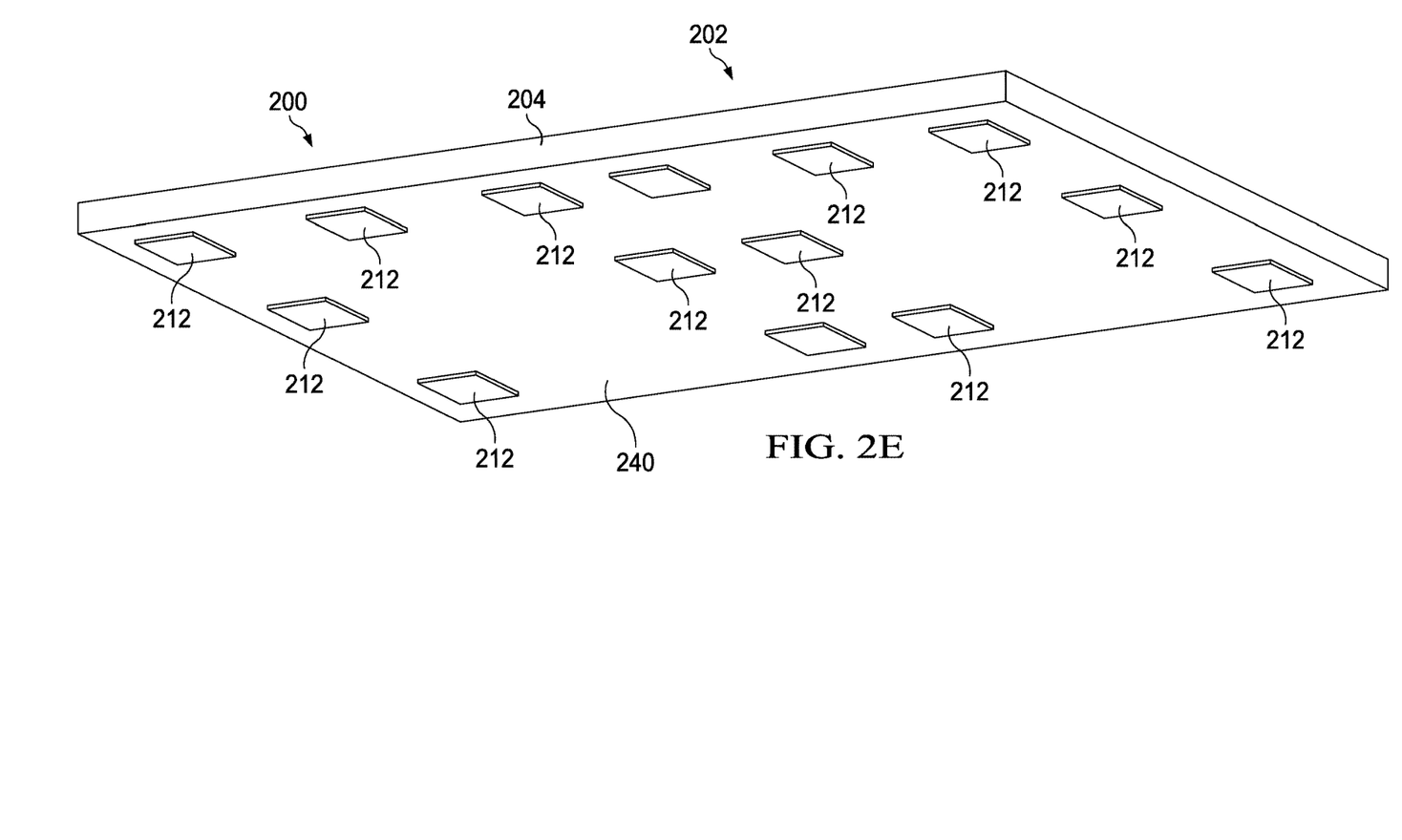

FIG. 2E shows a bottom surface 240 of the substrate 204 of the MEMS devices 200 and 202. The TSVs 236 of FIG. 2A terminate in bondpads 212 on the bottom surface 240. The MEMS devices 200 and 202 are subsequently singulated, and may optionally be encapsulated.

What is claimed is:

1. A microelectronic mechanical systems (MEMS) device, comprising:
   a substrate;
   a component disposed on the substrate;
   a headspace wall disposed on the substrate, surrounding the component, the headspace wall comprising a polymer material;
   a headspace cap disposed on the headspace wall, the headspace cap comprising a dry film polymer material, the headspace wall and the headspace cap isolating the component in a headspace; and a fin of the polymer material, the fin being disposed inside the headspace wall and contiguous with the headspace wall.

2. The MEMS device of claim 1, further comprising a pillar of the polymer material, the pillar being disposed inside the headspace wall and separate from the headspace wall.

3. The MEMS device of claim 1, wherein the headspace wall comprises polyimide.

4. The MEMS device of claim 1, wherein the headspace cap comprises epoxy.

5. The MEMS device of claim 1, further comprising a mold compound disposed on the substrate, the headspace wall and the headspace cap.

6. The MEMS device of claim 1, wherein the headspace wall is formed on a same surface of the substrate as the component.

7. The MEMS device of claim 6, wherein the headspace wall extends away from the surface of the substrate at least the same distance as the component extends away from the surface of the substrate.

8. The MEMS device of claim 7, wherein the headspace wall is attached at one end to the surface of the substrate and at another end to the headspace cap.

9. The MEMS device of claim 1, further comprising another fin of the polymer material, the another fin being disposed outside the headspace wall and contiguous with the headspace wall.

10. A microelectronic mechanical systems (MEMS) device, comprising:
   a component on a substrate;
   a polymer layer of a headspace wall on the substrate surrounding the component;
   a polymer dry film of a headspace cap on the headspace wall, so that the headspace cap and the headspace wall isolate the component;
   a polymer structure of the polymer layer inside the headspace wall and separate from the headspace wall; and
   a fin of the polymer material, the fin being disposed inside the headspace wall and contiguous with the headspace wall.

11. A microelectronic mechanical systems (MEMS) device, comprising:
   a substrate;
   a component disposed on the substrate;
   a headspace wall disposed on the substrate, surrounding the component, the headspace wall comprising a polymer material;
   a fin of the polymer material, the fin being disposed outside the headspace wall and contiguous with the headspace wall; and
   a headspace cap disposed on the headspace wall, the headspace cap comprising a dry film polymer material, the headspace wall and the headspace cap isolating the component in a headspace.

12. A microelectronic mechanical systems (MEMS) device, comprising:
   a component on a substrate;
   a polymer layer of a headspace wall on the substrate surrounding the component, wherein the headspace wall extends away from a surface of the substrate at least the same distance as the component extends away from the surface of the substrate;
   a polymer structure of the polymer layer inside the headspace wall and separate from the headspace wall;
   a fin of the polymer material of the headspace wall, the fin being disposed outside the headspace wall and contiguous with the headspace wall; and
   a polymer dry film of a headspace cap on the headspace wall, so that the headspace cap and the headspace wall isolate the component.

13. A microelectronic mechanical systems (MEMS) device, comprising:
   a component on a substrate;
   a polymer layer of a headspace wall on the substrate surrounding the component, wherein the headspace wall extends away from a surface of the substrate at least the same distance as the component extends away from the surface of the substrate;
   a polymer structure of the polymer layer inside the headspace wall and separate from the headspace wall;
   a first fin of the polymer material of the headspace wall, the first fin being disposed outside the headspace wall and contiguous with the headspace wall;
   a second fin of the polymer material of the headspace wall, the second fin being disposed inside the headspace wall and contiguous with the headspace wall; and
   a polymer dry film of a headspace cap on the headspace wall, so that the headspace cap and the headspace wall isolate the component.

\* \* \* \* \*